United States Patent
Klein

(10) Patent No.: US 7,340,668 B2
(45) Date of Patent: Mar. 4, 2008

(54) LOW POWER COST-EFFECTIVE ECC MEMORY SYSTEM AND METHOD

(75) Inventor: Dean A. Klein, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 537 days.

(21) Appl. No.: 10/877,720

(22) Filed: Jun. 25, 2004

(65) Prior Publication Data

US 2005/0289444 A1  Dec. 29, 2005

(51) Int. Cl.
*H03M 13/00* (2006.01)
(52) U.S. Cl. .................... 714/785; 714/763
(58) Field of Classification Search ........... 714/763, 714/785
See application file for complete search history.

(56) References Cited

U.S. PATENT DOCUMENTS

| | | | |
|---|---|---|---|
| 4,334,295 A | 6/1982 | Nagami | 365/222 |
| 4,598,402 A | 7/1986 | Matsumoto et al. | 371/38 |
| 4,706,249 A | 11/1987 | Nakagawa et al. | 371/38 |
| 4,710,934 A | 12/1987 | Traynor | 371/38 |
| 4,766,573 A | 8/1988 | Takemae | 365/222 |
| 4,780,875 A | 10/1988 | Sakai | 371/38 |
| 4,858,236 A | 8/1989 | Ogasawara | 371/38 |
| 4,862,463 A | 8/1989 | Chen | 371/38 |
| 4,918,692 A * | 4/1990 | Hidaka et al. | 714/702 |
| 4,937,830 A | 6/1990 | Kawashima et al. | 371/40.1 |
| 4,958,325 A | 9/1990 | Nakagome et al. | 365/206 |
| 5,056,089 A | 10/1991 | Furuta et al. | 371/3 |
| 5,127,014 A * | 6/1992 | Raynham | 714/754 |
| 5,172,339 A | 12/1992 | Noguchi et al. | 365/201 |
| 5,278,796 A | 1/1994 | Tillinghast et al. | 365/211 |
| 5,291,498 A | 3/1994 | Jackson et al. | 371/40.1 |
| 5,313,425 A | 5/1994 | Lee et al. | 365/201 |
| 5,313,464 A | 5/1994 | Reiff | 371/2.1 |
| 5,313,475 A | 5/1994 | Cromer et al. | 371/40.1 |
| 5,313,624 A | 5/1994 | Harriman et al. | 395/575 |
| 5,321,661 A | 6/1994 | Iwakiri et al. | 365/222 |
| 5,335,201 A | 8/1994 | Walther et al. | 365/222 |
| 5,369,651 A | 11/1994 | Marisetty | 371/40.1 |
| 5,418,796 A | 5/1995 | Price et al. | 371/39.1 |
| 5,428,630 A | 6/1995 | Weng et al. | 371/40.1 |
| 5,432,802 A | 7/1995 | Tsuboi | 371/40.1 |

(Continued)

OTHER PUBLICATIONS

J. Stojko and W. D. Watson, Error-Correction Code, (IBM Technical Disclosure Bulletin), pp. 1437-1438, vol. 10 No. 10, Mar. 1968.*

*Primary Examiner*—Jacques Louis-Jacques
*Assistant Examiner*—Esaw T. Abraham
(74) *Attorney, Agent, or Firm*—Dorsey & Whitney LLP

(57) ABSTRACT

A memory controller couples 32-bit data words to and from a DRAM. The DRAM generates error checking and correcting syndromes to check and correct read data. The DRAM generates the syndromes from respective 128-bit data words each formed by 4 32-bit data words written to the DRAM, and thereby achieves a low syndrome bit overhead. The memory controller may write data words to the DRAM having less than 128 bits by first reading 4 32-bit words from the DRAM, substituting the write data for a corresponding number of bits of read data, and writing the new 128-bit word to the DRAM by writing 4 32-bit words.

22 Claims, 5 Drawing Sheets

U.S. PATENT DOCUMENTS

| | | | |
|---|---|---|---|
| 5,446,695 A | 8/1995 | Douse et al. | 365/222 |
| 5,448,578 A | 9/1995 | Kim | 371/40.4 |
| 5,450,424 A | 9/1995 | Okugaki et al. | 371/40.1 |
| 5,455,801 A | 10/1995 | Blodgett et al. | 365/222 |
| 5,459,742 A * | 10/1995 | Cassidy et al. | 714/769 |
| 5,481,552 A | 1/1996 | Aldereguia et al. | 371/40.1 |
| 5,509,132 A | 4/1996 | Matsuda et al. | 395/403 |
| 5,513,135 A | 4/1996 | Dell et al. | 365/52 |
| 5,515,333 A | 5/1996 | Fujita et al. | 365/229 |
| 5,588,112 A | 12/1996 | Dearth et al. | 395/182.07 |
| 5,600,662 A | 2/1997 | Zook | 371/40.1 |
| 5,604,703 A | 2/1997 | Nagashima | 365/200 |
| 5,623,506 A | 4/1997 | Dell et al. | 371/40.1 |
| 5,629,898 A | 5/1997 | Idei et al. | 365/222 |
| 5,631,914 A * | 5/1997 | Kashida et al. | 714/755 |
| 5,703,823 A | 12/1997 | Douse et al. | 365/222 |
| 5,706,225 A | 1/1998 | Buchenrieder et al. | 365/102 |
| 5,712,861 A | 1/1998 | Inoue et al. | 371/37.1 |
| 5,732,092 A | 3/1998 | Shinohara | 371/40.2 |
| 5,740,188 A | 4/1998 | Olarig | 371/40.11 |
| 5,754,753 A * | 5/1998 | Smelser | 714/8 |
| 5,761,222 A | 6/1998 | Baldi | 371/40.18 |
| 5,765,185 A | 6/1998 | Lambrache et al. | 711/103 |
| 5,784,328 A | 7/1998 | Irrinki et al. | 365/222 |
| 5,784,391 A | 7/1998 | Konigsburg | 371/40.18 |
| 5,808,952 A | 9/1998 | Fung et al. | 365/222 |
| 5,841,418 A | 11/1998 | Bril et al. | 345/3 |
| 5,864,569 A | 1/1999 | Roohparvar | 371/40.18 |
| 5,878,059 A | 3/1999 | Maclellan | 371/40.13 |
| 5,896,404 A | 4/1999 | Kellogg et al. | 371/40.11 |
| 5,912,906 A | 6/1999 | Wu et al. | 371/40.11 |
| 5,953,278 A | 9/1999 | McAdams et al. | 365/219 |
| 5,961,660 A | 10/1999 | Capps, Jr. et al. | 714/763 |
| 5,963,103 A | 10/1999 | Blodgett | 331/75 |
| 6,009,547 A | 12/1999 | Jaquette et al. | 714/758 |
| 6,009,548 A | 12/1999 | Chen et al. | 714/758 |
| 6,018,817 A | 1/2000 | Chen et al. | 714/762 |
| 6,041,001 A | 3/2000 | Estakhri | 365/200 |
| 6,041,430 A * | 3/2000 | Yamauchi | 714/752 |
| 6,085,283 A | 7/2000 | Toda | 711/104 |
| 6,085,334 A | 7/2000 | Giles et al. | 714/7 |
| 6,092,231 A | 7/2000 | Sze | 714/758 |
| 6,101,614 A | 8/2000 | Gonzales et al. | 714/6 |
| 6,125,467 A | 9/2000 | Dixon | 714/763 |
| 6,134,167 A | 10/2000 | Atkinson | 365/222 |
| 6,178,537 B1 | 1/2001 | Roohparvar | 714/773 |
| 6,199,139 B1 | 3/2001 | Katayama et al. | 711/106 |
| 6,212,118 B1 | 4/2001 | Fujita | 365/222 |
| 6,212,631 B1 | 4/2001 | Springer et al. | 713/1 |
| 6,216,246 B1 | 4/2001 | Shau | 714/763 |
| 6,216,247 B1 | 4/2001 | Creta et al. | 714/763 |
| 6,219,807 B1 | 4/2001 | Ebihara et al. | 714/720 |
| 6,223,309 B1 | 4/2001 | Dixon et al. | 714/703 |
| 6,233,717 B1 | 5/2001 | Choi | 714/805 |
| 6,262,925 B1 | 7/2001 | Yamasaki | 365/200 |
| 6,279,072 B1 | 8/2001 | Williams et al. | 711/105 |
| 6,310,825 B1 | 10/2001 | Furuyama | 365/233 |
| 6,324,119 B1 | 11/2001 | Kim | 365/233 |
| 6,349,068 B2 | 2/2002 | Takemae et al. | 365/222 |
| 6,349,390 B1 | 2/2002 | Dell et al. | 714/6 |
| 6,353,910 B1 | 3/2002 | Carnevale et al. | 714/763 |
| 6,397,290 B1 | 5/2002 | Williams et al. | 711/105 |
| 6,397,357 B1 | 5/2002 | Cooper | 714/703 |
| 6,397,365 B1 | 5/2002 | Brewer et al. | 714/766 |
| 6,438,066 B1 | 8/2002 | Ooishi et al. | 365/233 |
| 6,442,644 B1 | 8/2002 | Gustavson et al. | 711/105 |
| 6,457,153 B2 | 9/2002 | Yamamoto et al. | 714/763 |
| 6,484,246 B2 | 11/2002 | Tsuchida et al. | 711/169 |
| 6,510,537 B1 | 1/2003 | Lee | 714/763 |
| 6,526,537 B2 | 2/2003 | Kishino | 714/763 |
| 6,556,497 B2 | 4/2003 | Cowles et al. | 365/222 |
| 6,557,072 B2 | 4/2003 | Osborn | 711/106 |
| 6,560,155 B1 | 5/2003 | Hush | 365/222 |
| 6,584,543 B2 | 6/2003 | Williams et al. | 711/105 |
| 6,591,394 B2 | 7/2003 | Lee et al. | 714/766 |
| 6,594,796 B1 | 7/2003 | Chiang | 714/800 |
| 6,601,211 B1 | 7/2003 | Norman | 714/773 |
| 6,603,694 B1 | 8/2003 | Frankowsky et al. | 365/222 |
| 6,609,236 B2 | 8/2003 | Watanabe et al. | 716/8 |
| 6,614,698 B2 | 9/2003 | Ryan et al. | 365/189.04 |
| 6,618,281 B1 | 9/2003 | Gordon | 365/49 |
| 6,618,319 B2 | 9/2003 | Ooishi et al. | 365/233 |
| 6,628,558 B2 | 9/2003 | Fiscus | 365/222 |
| 6,636,444 B2 | 10/2003 | Uchida et al. | 365/189.05 |
| 6,636,446 B2 | 10/2003 | Lee et al. | 365/194 |
| 6,646,942 B2 | 11/2003 | Janzen | 365/222 |
| 6,662,333 B1 | 12/2003 | Zhang et al. | 714/767 |
| 6,665,231 B2 | 12/2003 | Mizuno et al. | 365/233 |
| 6,678,860 B1 | 1/2004 | Lee | 714/763 |
| 6,697,926 B2 | 2/2004 | Johnson et al. | 711/167 |
| 6,697,992 B2 | 2/2004 | Ito et al. | 714/763 |
| 6,701,480 B1 | 3/2004 | Karpuszka et al. | 714/764 |
| 6,704,230 B1 | 3/2004 | DeBrosse et al. | 365/201 |
| 6,715,104 B2 * | 3/2004 | Imbert de Tremiolles et al. | 714/25 |
| 6,715,116 B2 | 3/2004 | Lester et al. | 714/718 |
| 6,735,726 B2 | 5/2004 | Muranaka et al. | 714/708 |
| 6,751,143 B2 | 6/2004 | Morgan et al. | 365/222 |
| 6,754,858 B2 | 6/2004 | Borkenhagen et al. | 714/720 |
| 6,775,190 B2 | 8/2004 | Setogawa | 365/193 |
| 6,778,457 B1 | 8/2004 | Burgan | 365/222 |
| 6,781,908 B1 | 8/2004 | Pelley et al. | 365/222 |
| 6,788,616 B2 | 9/2004 | Takahashi | 365/233 |
| 6,789,209 B1 | 9/2004 | Suzuki et al. | 713/401 |
| 6,792,567 B2 | 9/2004 | Laurent | 714/763 |
| 6,795,362 B2 | 9/2004 | Nakai et al. | 365/222 |
| 6,807,108 B2 | 10/2004 | Maruyama et al. | 365/189.05 |
| 6,810,449 B1 | 10/2004 | Barth et al. | 710/61 |
| 6,819,624 B2 | 11/2004 | Acharya et al. | 365/233 |
| 6,834,022 B2 | 12/2004 | Derner et al. | 365/222 |
| 6,934,461 B1 | 8/2005 | Strub et al. | 365/194 |
| 6,940,773 B2 | 9/2005 | Poechmueller | 365/222 |
| 7,171,605 B2 | 1/2007 | White | 714/763 |
| 2001/0023496 A1 | 9/2001 | Yamamoto et al. | 714/763 |
| 2001/0029592 A1 | 10/2001 | Walker et al. | 714/42 |
| 2001/0044917 A1 | 11/2001 | Lester et al. | 714/718 |
| 2001/0052090 A1 | 12/2001 | Mio | 714/42 |
| 2001/0052102 A1 | 12/2001 | Roohparvar | 714/773 |
| 2002/0013924 A1 | 1/2002 | Yamasoto | 714/763 |
| 2002/0029316 A1 | 3/2002 | Williams et al. | 711/105 |
| 2002/0144210 A1 | 10/2002 | Borkenhagen et al. | 714/805 |
| 2002/0152444 A1 | 10/2002 | Chen et al. | 714/785 |
| 2002/0162069 A1 | 10/2002 | Laurent | 714/763 |
| 2002/0184592 A1 | 12/2002 | Koga et al. | 714/763 |
| 2003/0009721 A1 | 1/2003 | Hsu et al. | 714/773 |
| 2003/0070054 A1 | 4/2003 | Williams et al. | 711/173 |
| 2003/0093744 A1 | 5/2003 | Leung et al. | 714/763 |
| 2003/0097608 A1 | 5/2003 | Rodeheffer et al. | 714/7 |
| 2003/0101405 A1 | 5/2003 | Shibata | 714/763 |
| 2003/0149855 A1 | 8/2003 | Shibata et al. | 711/200 |
| 2003/0167437 A1 | 9/2003 | DeSota et al. | 714/763 |
| 2003/0191888 A1 | 10/2003 | Klein | 711/105 |
| 2004/0008562 A1 | 1/2004 | Ito et al. | 365/223 |
| 2004/0064646 A1 | 4/2004 | Emerson et al. | 711/131 |
| 2004/0083334 A1 | 4/2004 | Chang et al. | 711/103 |
| 2004/0098654 A1 | 5/2004 | Cheng et al. | 714/758 |
| 2004/0117723 A1 | 6/2004 | Foss | 714/805 |
| 2004/0225944 A1 | 11/2004 | Brueggen | 714/758 |
| 2005/0099868 A1 | 5/2005 | Oh | 365/222 |

* cited by examiner ated, a pair of digit lines for each memory cell are switched to complementary voltages and then equilibrated. As a result, DRAM refreshes tends to be particularly power-hungry operations. Further, since refreshing memory cells must be accomplished even when the DRAM is not being used and is thus inactive, the amount of power consumed by refresh is a critical determinant of the amount of power consumed by the DRAM over an extended period. Thus many attempts to reduce power consumption in DRAM devices have focused on reducing the rate at which power is consumed during refresh.

LOW POWER COST-EFFECTIVE ECC MEMORY SYSTEM AND METHOD

TECHNICAL FIELD

This invention relates to dynamic random access memory ("DRAM") devices, and, more particularly, to a method and system for checking and correcting data read from memory devices in a manner that is cost-effective and consumes relatively little power.

BACKGROUND OF THE INVENTION

As the use of electronic devices, such as personal computers, continue to increase, it is becoming ever more important to make such devices portable. The usefulness of portable electronic devices, such as notebook computers, is limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices such a notebook computers, typically include dynamic random access memory ("DRAM") devices that consume a substantial amount of power. As the data storage capacity and operating speeds of DRAM devices continues to increase, the power consumed by such devices has continued to increase in a corresponding manner.

In general, the power consumed by a DRAM device increases with both the capacity and the operating speed of the DRAM devices. The power consumed by DRAM devices is also affected by their operating mode. A DRAM device for example, will generally consume a relatively large amount of power when the memory cells of the DRAM device are being refreshed. As is well-known in the art, DRAM memory cells, each of which essentially consists of a capacitor, must be periodically refreshed to retain data stored in the DRAM device. Refresh is typically performed by essentially reading data bits from the memory cells in each row of a memory cell array and then writing those same data bits back to the same cells in the row. A relatively large amount of power is consumed when refreshing a DRAM because rows of memory cells in a memory cell array are being actuated in the rapid sequence. Each time a row of memory cells is actu Refresh power can, of course, be reduced by reducing the rate at which the memory cells in a DRAM are being refreshed. However, reducing the refresh rate increases the risk that data stored in the DRAM memory cells will be lost. More specifically, since, as mentioned above, DRAM memory cells are essentially capacitors, charge inherently leaks from the memory cell capacitors, which can change the value of a data bit stored in the memory cell over time. However, current leaks from capacitors at varying rates. Some capacitors are essentially short-circuited and are thus incapable of storing charge indicative of a data bit. These defective memory cells can be detected during production testing, and can then be repaired by substituting non-defective memory cells using conventional redundancy circuitry. On the other hand, current leaks from most DRAM memory cells at much slower rates that span a wide range. A DRAM refresh rate is chosen to ensure that all but a few memory cells can store data bits without data loss. This refresh rate is typically once every 64 ms. The memory cells that cannot reliably retain data bits at this refresh rate are detected during production testing and replaced by redundant memory cells.

One technique that has been used to prevent data errors during refresh as well as at other times is to generate an error correcting code "ECC," which is known as a "syndrome," from each item of stored data, and then store the syndrome along with the data. When the data are read from the memory device, the syndrome is also read, and it is then used to determine if any bits of the data are in error. As long as not too many data bits are in error, the syndrome may also be used to correct the read data.

A computer system 10 employing typical ECC techniques is shown in FIG. 1. The computer system 10 includes a central processor unit ("CPU") 14 coupled to a system controller 16 through a processor bus 18. The system controller 16 is coupled to input/output ("I/O") devices (not shown) through a peripheral bus 20 and to an I/O controller 24 through an expansion bus 26. The I/O controller 24 is also connected to various peripheral devices (not shown) through an I/O bus 28.

The system controller 16 includes a memory controller 30 that is coupled to a dynamic random access memory ("DRAM") 32 through an address bus 36, a control bus 38, a syndrome bus 40, and a data bus 42. The DRAM 32 includes an array 34 of memory cells that stores data and a syndrome coupled through the data bus 42 and the syndrome bus 40, respectively. The locations in the DRAM 32 to which data are written and data are read are designated by addresses coupled to the DRAM 32 on the address bus 36. The operation of the DRAM is controlled by control signals coupled to the DRAM 32 on the control bus 38.

In operation, when data are to be written to the DRAM 32, the memory controller 30 generates a syndrome and then couples the syndrome and the write data to the DRAM 32 through the syndrome bus 40 and the data bus 42, respectively. The memory controller 30 also couples control signals to the DRAM 32 through the control bus 38 and a memory address through the address bus 36. The data are then stored in an array 34 of DRAM memory cells. When the stored data are to be read from the DRAM 32, the memory controller 30 applies control signals to the DRAM 32 through the control bus 38 and a memory address to the DRAM 32 through the address bus 36. Read data and the corresponding syndrome are then coupled from the DRAM 32 to the memory controller 30 through the data bus 42 and syndrome bus 40, respectively. The memory controller 30 then uses the syndrome to determine if any bits of the read data are in error, if not too many bits are in error, to correct the read data.

The use of ECC techniques can significantly improve the reliability of data stored in the DRAM 32. Furthermore, the use of ECC techniques can allow the DRAM to be refreshed at a slower refresh rate since resulting data bit errors can be corrected. The use of a slower refresh rate can provide the significant advantage of reducing the power consumed by the DRAM 32. However, the need to perform ECC processing on read data all during refresh can consume a significant amount of power. Further, the use of ECC techniques requires that a significant portion of the DRAM storage capacity be used to store the syndromes, thus requiring that the size of the DRAM semiconductor die be increased to maintain the storage capacity of the DRAM 32. Further, to the extent that power is required to store the syndromes, the use of ECC techniques can increase power consumption. The amount of power consumed by storage of the syndrome each time data are written to the DRAM 32 is a function of the number of bits in the syndrome. The size of the syndrome needed to correct single bit errors is determined by the number of bits in the data being checked and corrected, and is given by the following table:

TABLE 1

| Data Bits | Syndrome Bits | Syndrome Bit Overhead |
|-----------|---------------|-----------------------|
| 8         | 4             | 50%                   |
| 16        | 5             | 31%                   |
| 32        | 6             | 19%                   |
| 64        | 7             | 11%                   |
| 128       | 8             | 6%                    |

In general, the syndrome bit overhead, expressed as the ratio of the number of necessary syndrome bits (i.e., N+1) to the number of data bits (i.e., $2^N$), is equal to $(N+1)/2^N$. As the numerator increases linearly with N and the denominator increases geometrically with N, it is apparent that significantly greater efficiencies can be achieved with higher values of N, i.e., syndromes generated from a greater number of data bits. However, memory controllers generally do not write data to DRAMs or read data from DRAMs using very wide data paths. For example, in the computer system 10 shown in FIG. 1, the data bus 42 has a width of only 32 bits, and a 32-bit word would require 6 syndrome bits, which would result in a 16% syndrome overhead. As a result, the extent to which syndrome bit overhead can be reduced is very limited.

There is therefore a need for a memory system and method that detects and corrects errors in data stored in DRAMs while consuming relatively little power and consuming relatively little space on a semiconductor die, and which does not require substantial modifications in the operation of memory controllers that are coupled to the DRAMS.

SUMMARY OF THE INVENTION

An error checking and correcting memory device and method includes on-board circuitry for generating a syndrome from the data written to the memory device. The syndrome is generated from more bits of write data than the number of write data bits that can be simultaneously coupled to the memory device. More specifically, the syndrome is generated from several write data words that are sequentially coupled to the memory device. The memory device uses the syndrome to check and correct any data that are read from the memory device. The use of data having a large number of bits to generate the syndrome allows the syndrome bit overhead to be relatively low so that a significant amount of storage capacity is not used to store the syndrome.

DETAILED DESCRIPTION

Figure 1:
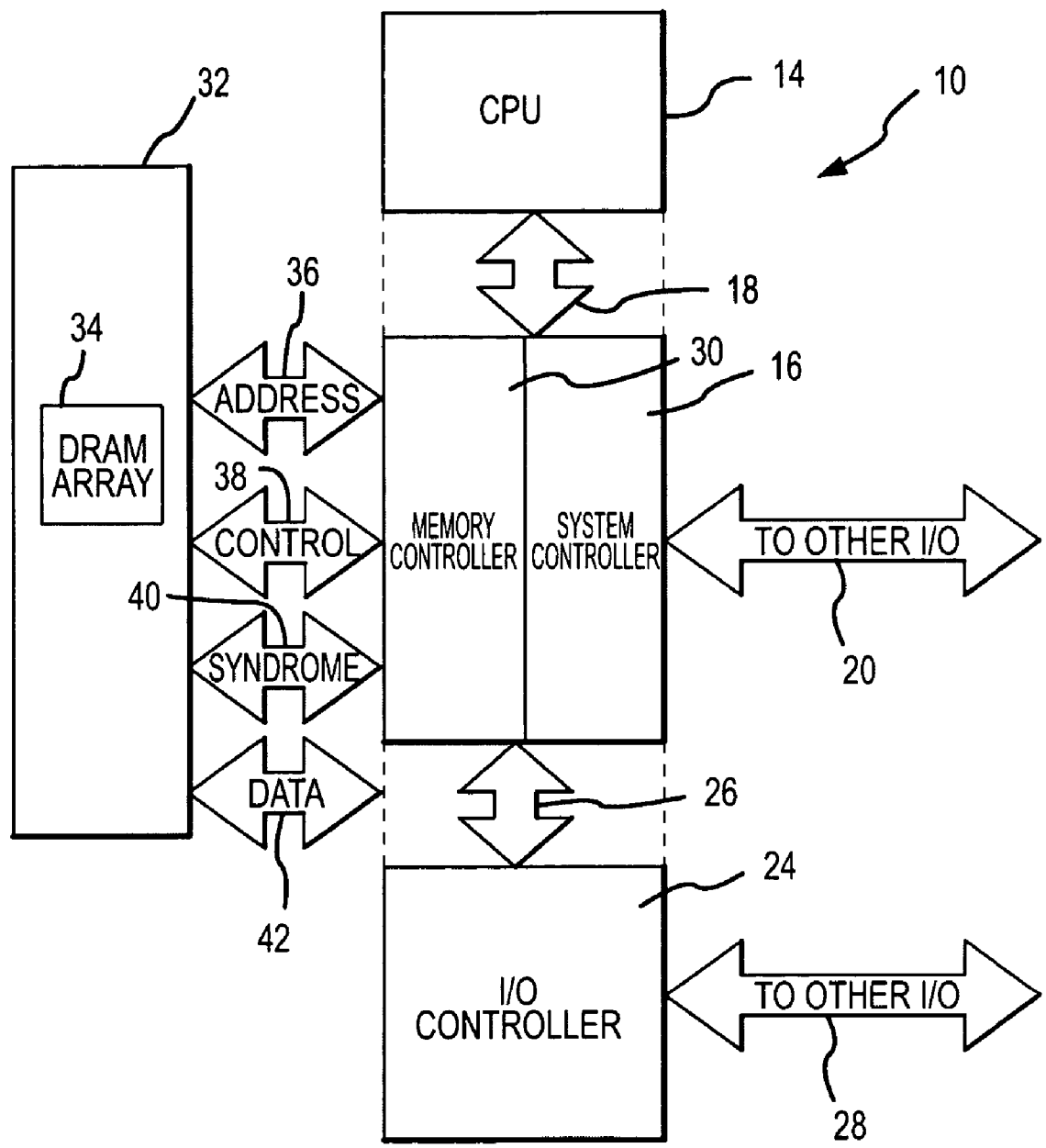
FIG. 1 is a block diagram of a conventional computer system.
Figure 2:
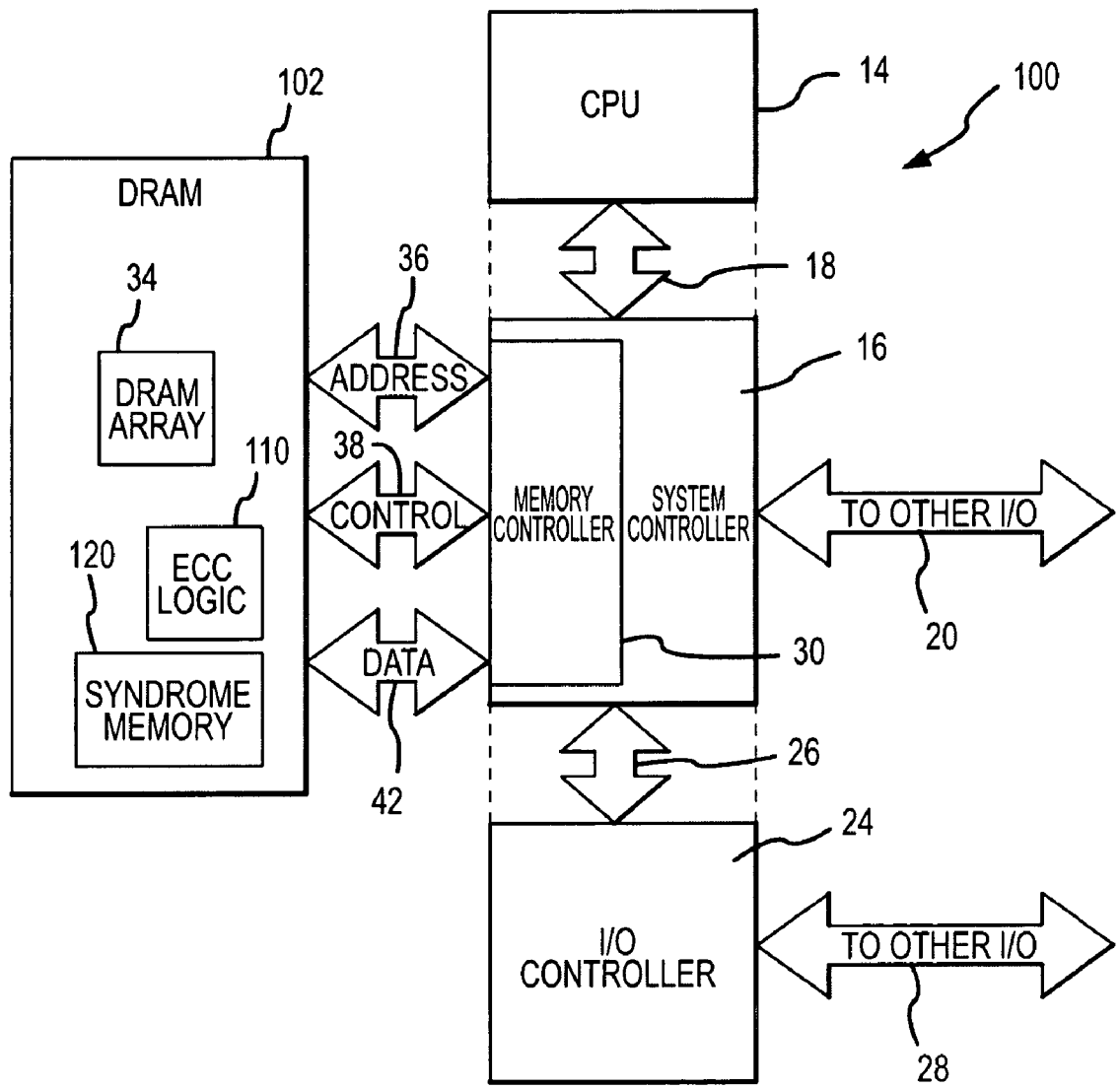
FIG. 2 is a block diagram of a computer system according to one embodiment of the invention.

A computer system 100 according to one embodiment of the invention is shown in FIG. 2. The computer system 100 uses many of the same components that are used in the conventional computer system 10 of FIG. 1. Therefore, in the interest of brevity, these components have been provided with the same reference numerals, and an explanation of their operation will not be repeated. The computer system 100 of FIG. 2 differs from the computer system 10 of FIG. 1 by including a DRAM 102 that includes a syndrome memory 120 and ECC logic 110, and by omitting a syndrome bus. The ECC logic 110 generates a syndrome from write data received from the memory controller 30, and stores the syndrome in the syndrome memory 120 while the write data are being stored in the DRAM array 34. When data are read from the DRAM array 34, the read data are coupled from the array 34 to the ECC logic 110 and the syndrome are coupled from the syndrome memory 120 to the ECC logic 110. The ECC logic 110 then uses the syndrome to determine if the read data contains an erroneous data bit, and, if more than one data bit is not in error, to correct the erroneous data bit. The corrected read data are then coupled to the memory controller 30 through the data bus 42. Although the syndrome memory 120 may be a separate memory as shown in FIG. 2, it may alternatively be included in the DRAM array 34, as explained in greater detail below.

The DRAM 102 is able to use ECC techniques with relatively little syndrome bit overhead by generating syndromes from a relatively wide data word. In one embodiment of the invention, a data bus 42 having a width of 32 bits is used. However, in that embodiment, the ECC logic 110 generates syndromes from 128-bit data words. Therefore, every write requires that 4 32-bit words be coupled through the data bus 42. As shown in Table 1, the 128 bit word requires a syndrome of only 8 bits, which achieves a syndrome bit overhead of only 6 percent.

Figure 3:
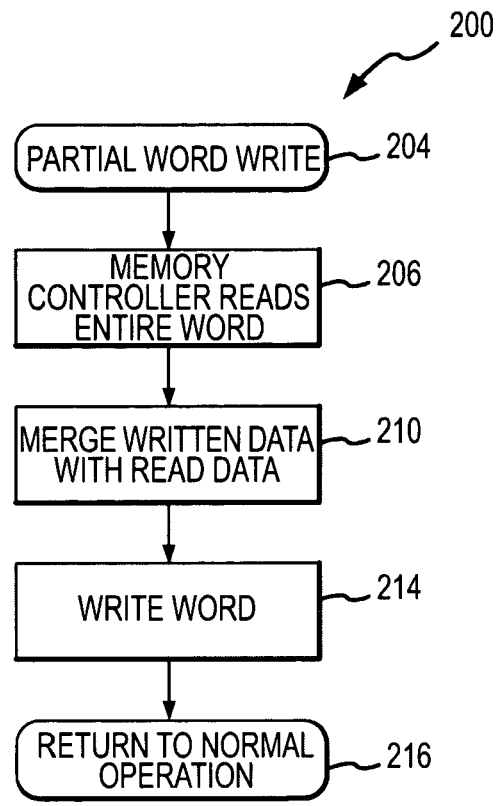
FIG. 3 is a flow chart showing the manner in which a partial data word is written in the computer system of FIG. 2 to allow a syndrome to be generated based on a full word.
Figure 4:
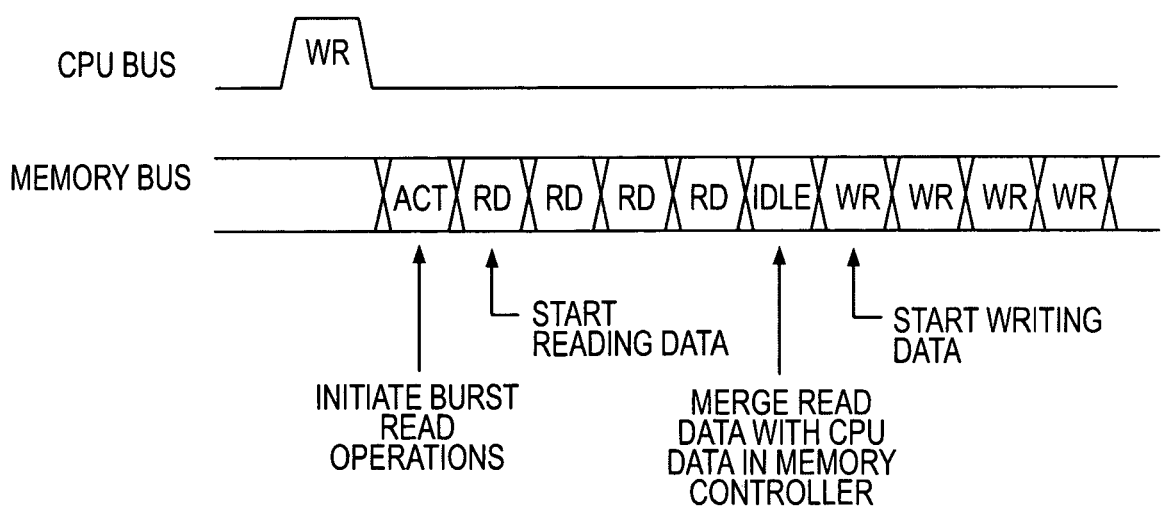
FIG. 4 is a timing diagram showing signals used to perform the operation shown in FIG. 3.

As mentioned above, the ECC logic 110 generates syndromes from 128-bit data words, but the memory controller 30 often writes data to the DRAM 102 in bytes consisting of 8 bits or some other number of bits less than 128 bits. To solve this problem the computer system 100 operates in a manner that allows the ECC logic 110 to generate a syndrome when only 8 bits, or data having less than 128 bits, are being written to the DRAM 102. The manner in which the computer system 100 operates in this manner will now be explained with reference to a flow chart 200 shown in FIG. 3 and a timing diagram shown in FIG. 4. In explaining the operation of the computer system 100, the assumption will be made that the data bus 42 has a width of 32 bits, and the CPU 14 is writing a partial word of 8 bits. With reference to FIG. 3, the partial word write 200 is entered at 204 when the CPU 14 places a write ("WR") command on the CPU bus 18, as shown in FIG. 4. The memory controller 30 then reads the entire 128-bit word that encompasses the address to which the 8-bits are to be written at step 206. This read is accomplished by the memory controller 30 coupling an active row command ("ACT") to the DRAM 102 through the control bus 38, as shown in FIG. 4. Four 32-bit words that encompass the 128-bit word are then coupled from the DRAM 102 to the memory controller 30 through the data bus 42 responsive to four read ("RD") commands coupled through the control bus 38. The 8-bits bits to be written to the DRAM 102 are then substituted for corresponding bits in one of the 32-bit words read from the DRAM 102 at step 210. The memory controller 30 then formulates a new 128-bit word from three of the 32-bit words that were read from the DRAM 102 and the new 32-bit word containing the 8 new bits and 24 bits read from the DRAM 102. After an idle period ("Idle") shown in FIG. 4, the new 128-bit word is written to the DRAM 102 at step 214 by coupling 4 write commands ("WR") to the DRAM 102 through the control bus 38, as also shown in FIG. 4. The ECC logic 110 receives the 4 32-bit words that constitute the 128-bit word, generates an 8-bit syndrome from the 128-bit word. The 128-bit word is then written to the DRAM array 34 and the 8-bit syndrome is written to the syndrome memory 120. The computer system then returns to normal operation through step 216.

Although the operation of the computer system 100 has been explained in the context of a system 100 having a 32-bit data bus 42 and ECC logic that generates a syndrome from 128-bit data words formed by 4 32-bit words, it will be understood that computer systems may use data buses having different widths, and the word from which the syndrome is formed, which may be other than 128 bits, may be formed by a lesser or greater number of smaller words, such as words having 32-bits.

Figure 5:
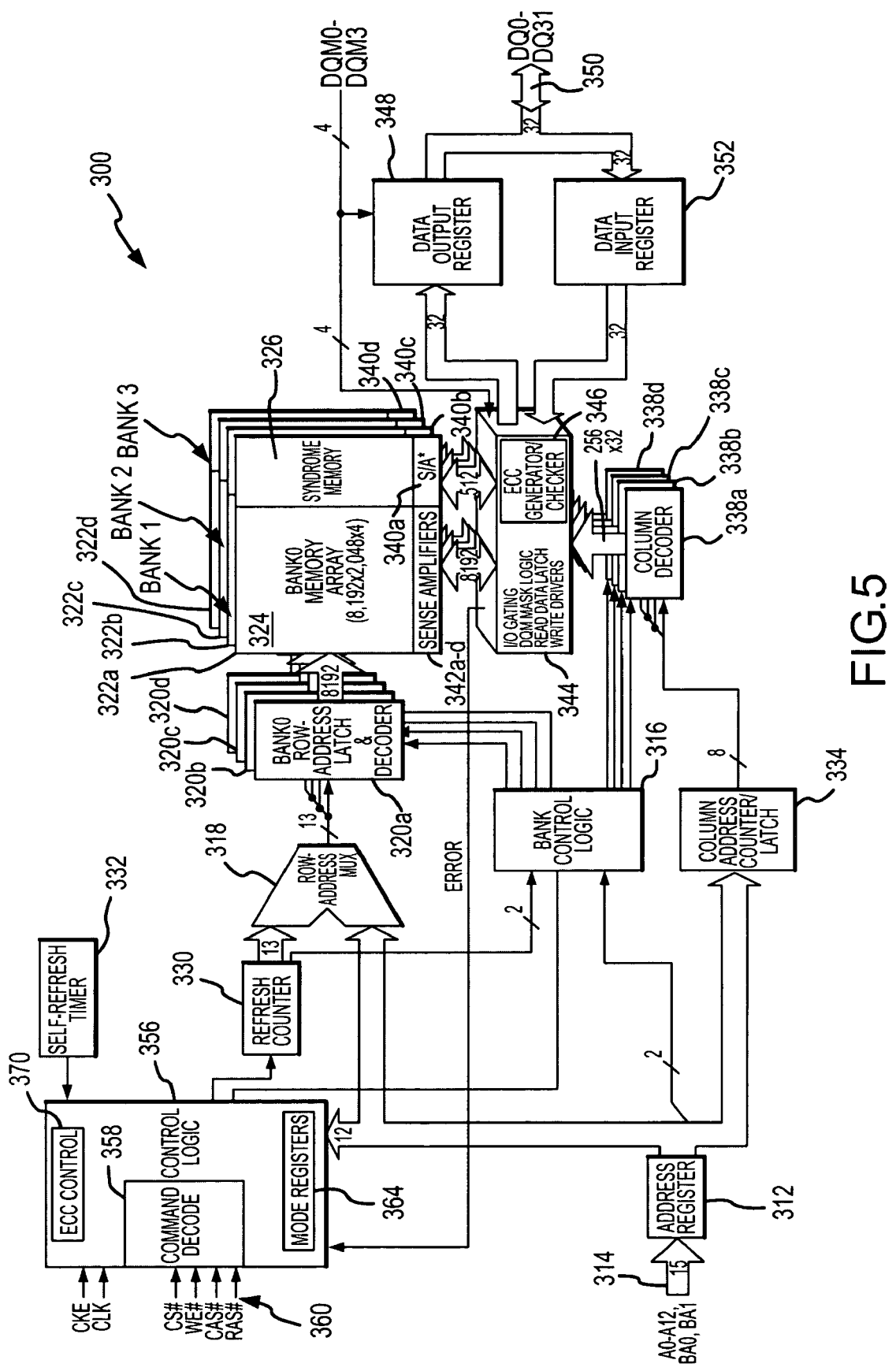
FIG. 5 is a block diagram of a memory device according to one embodiment of the invention that may be used in the computer system of FIG. 2.

A synchronous DRAM ("SDRAM") 300 according to one embodiment of the invention is shown in FIG. 5. The SDRAM 300 includes an address register 312 that receives bank addresses, row addresses and column addresses on an address bus 314. The address bus 314 is generally coupled to a memory controller (not shown in FIG. 5). Typically, a bank address is received by the address register 312 and is coupled to bank control logic 316 that generates bank control signals, which are described further below. The bank address is normally coupled to the SDRAM 300 along with a row address. The row address is received by the address register 312 and applied to a row address multiplexer 318. The row address multiplexer 318 couples the row address to row address latch & decoder circuit 320a-d for each of several banks of memory cell arrays 322a-d, respectively. Each bank 320a-d is divided into two sections, a data second 324 that is used for storing data, and a syndrome section 326 that is used for storing syndromes. Thus, unlike the SDRAM 102 of FIG. 2, a separate syndrome memory 120 is not used in the SDRAM 300 of FIG. 5.

One of the latch & decoder circuits 320a-d is enabled by a control signal from the bank control logic 316 depending on which bank of memory cell arrays 322a-d is selected by the bank address. The selected latch & decoder circuit 320 applies various signals to its respective bank 322 as a function of the row address stored in the latch & decoder circuit 320. These signals include word line voltages that activate respective rows of memory cells in the banks 322. The row address multiplexer 318 also couples row addresses to the row address latch & decoder circuits 320a-d for the purpose of refreshing the memory cells in the banks 322a-d. The row addresses are generated for refresh purposes by a refresh counter 330. During operation in a self-refresh mode, the refresh counter 330 periodically begins operating at times controlled by a self-refresh timer 332.

After the bank and row addresses have been applied to the address register 312, a column address is applied to the address register 312. The address register 312 couples the column address to a column address counter/latch circuit 334. The counter/latch circuit 334 stores the column address, and, when operating in a burst mode, generates column addresses that increment from the received column address. In either case, either the stored column address or incrementally increasing column addresses are coupled to column address & decoders 338a-d for the respective banks 322a-d. The column address & decoders 338a-d apply various signals to respective sense amplifiers 340a-d and 342a-d through column interface circuitry 344. The column interface circuitry 344 includes conventional I/O gating circuits, DQM mask logic, read data latches for storing read data from the memory cells in the banks 322 and write drivers for coupling write data to the memory cells in the banks 322. The column interface circuitry 344 includes the ECC generator/checker 346 that is the ECC logic 110 in the DRAM 102 of FIG. 2.

Syndromes read from the syndrome section 326 of one of the banks 322a-d are sensed by the respective set of sense amplifiers 340a-d and then coupled to the ECC generator checker 346. Data read from the data section 324 one of the banks 322a-d are sensed by the respective set of sense amplifiers 342a-d and then stored in the read data latches in the column interface circuitry 344. The data are then coupled to a data output register 348, which applies the read data to a data bus 350. Data to be written to the memory cells in one of the banks 322a-d are coupled from the data bus 350 through a data input register 352 to write drivers in the column interface circuitry 344. The write drivers then couple the data to the memory cells in one of the banks 322a-d. A data mask signal "DQM" is applied to the column interface circuitry 344 and the data output register 348 to selectively alter the flow of data into and out of the column interface circuitry 344, such as by selectively masking data to be read from the banks of memory cell arrays 322a-d.

The above-described operation of the SDRAM 300 is controlled by control logic 356, which includes a command decoder 358 that receives command signals through a command bus 360. These high level command signals, which are typically generated by a memory controller (not shown in FIG. 5), are a clock a chip select signal CS#, a write enable signal WE#, a column address strobe signal CAS#, and a row address strobe signal RAS#, with the "#" designating the signal as active low. Various combinations of these signals are registered as respective commands, such as a read command or a write command. The control logic 356 also receives a clock signal CLK and a clock enable signal CKE#, which cause the SDRAM 300 to operate in a synchronous manner. The control logic 356 generates a sequence of control signals responsive to the command signals to carry out the function (e.g., a read or a write) designated by each of the command signals. The control logic 356 also applies signals to the refresh counter 330 to control the operation of the refresh counter 330 during refresh of the memory cells in the banks 322. The control signals generated by the control logic 356, and the manner in which they accomplish their respective functions, are conventional. Therefore, in the interest of brevity, a further explanation of these control signals will be omitted.

The control logic 356 also includes a mode register 364 that may be programmed by signals coupled through the command bus 360 during initialization of the SDRAM 300. The mode register 364 then generates mode control signals that are used by the control logic 356 to control the operation of the SDRAM 300 in various modes. Finally, the control logic 356 also includes an ECC controller 370 that causes the control logic 356 to issue control signals to the ECC generator checker 346 and other components to generate syndromes for storage in the syndrome section 326 of the banks 322a-d, and to check and correct data read from the data section 324 of the banks 322a-d using syndromes stored in the sections 326.

Figure 6:
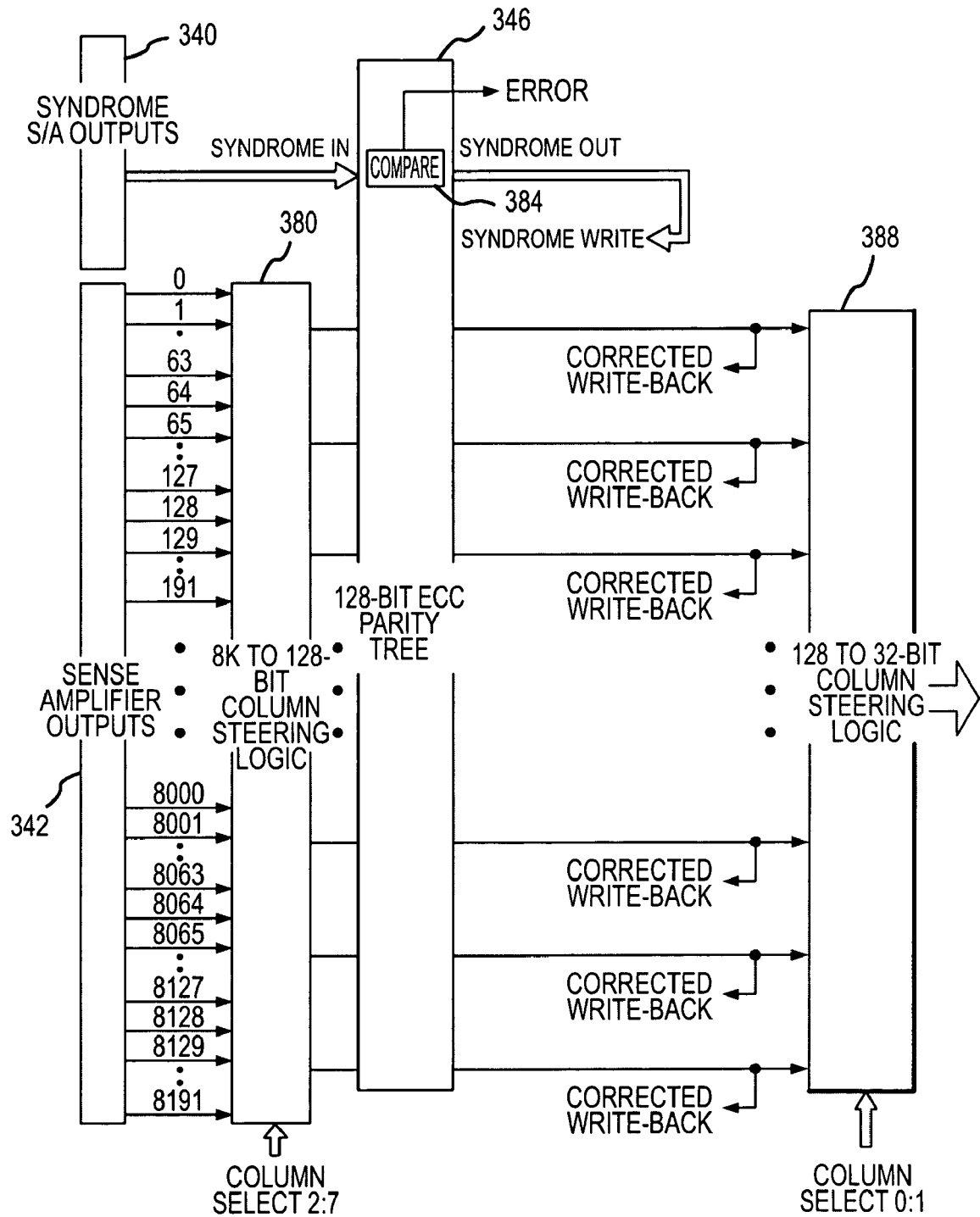
FIG. 6 is a block diagram showing a portion of the memory device of FIG. 5 in greater detail.

The interfaces between the sense amplifiers 340, 342, the ECC generator/checker 346 and certain components in the column interface circuitry 344 are shown in greater detail in FIG. 6. The sense amplifiers 342 coupled to the data sections 342 of the memory banks 322a-d output respective data bits for respective columns, which are applied to column steering logic 380. In the embodiment shown in FIG. 6, the sense amplifiers 342 output respective data bits for 8,192 columns. The column steering logic 380 uses the 6 most significant bits 2-7 of a column address to select 1 of 64 128-bit groups of data bits and couples the data bits to the ECC generator/checker 346. The sense amplifiers 340 coupled to the syndrome section of the memory banks 322a-d couple a syndrome corresponding to the read data directly to the ECC generator/checker 346.

The ECC generator/checker 346 includes a comparator 384 that provides an error indication in the event the read data contains an error. The ECC generator/checker 346 then couples the corrected 128-bit word to additional column steering logic 388, and also couples the corrected 128-bit word back through the column steering logic 380 to the banks 322a-d so that the banks will now contain correct data. The column steering logic 388 uses the 2 least significant bits 0-1 of a column address to select 1 of 4 32-bit groups of data bits and couples the data bits to the memory controller 30 (FIG. 2), as previously explained. It is not necessary for the column steering logic 388 to couple the syndrome to the memory controller 30 so that the operation error checking and correction function is transparent to the memory controller 30. Also, although 128 bits of write data are used to form the syndrome, it is not necessary for the memory device 102 to include externally accessible data terminals for each of these 128 bits.

Although the present invention has been described with reference to the disclosed embodiments, persons skilled in the art will recognize that changes may be made in form and detail without departing from the spirit and scope of the invention. For example, although the 128-bit write data word has been described of as being formed from 96 bits of read data and 8 bits of new write data, it will be understood that the 128-bit write data may be formed by other means.

I claim:

1. A memory device, comprising:
   an array of memory cells arranged in rows and columns;
   a syndrome memory storing error checking and correcting syndromes corresponding to respective subsets of bits of data stored in the array of memory cells, the number of bits in each subset of data bits stored in the array of memory cells being less than the number of data bits stored in each row of memory cell in the array;
   an address decoder receiving row addresses and column addresses, the address decoder activating a row of memory cells corresponding to each received row address and to select a memory cell in a column of memory cells corresponding to each received column address;
   a read data path to couple read data from selected memory cells in an activated row to a predetermined number of data bus terminals, the predetermined number of data bus terminals being less than the number of bits in each subset of data bits stored in the array;
   a write data path to couple write data from the predetermined number of data bus terminals to selected memory cells in an activated row;
   a first set of column steering logic coupled to the array of memory cells, the first set of column steering logic selecting each of the subsets of data bits read from a corresponding subset of columns of the array of memory cells and outputting the selected subset of read data bits;
   error checking and correcting logic coupled to receive the selected subset of read data bits from the first set of column steering logic and the corresponding error checking and correcting syndromes from the syndrome memory, the error checking and correcting logic generating an error checking and correcting syndrome in the memory device from the selected subset of read data bits and comparing the generated error checking and correcting syndrome to the error checking and correcting syndrome received from the syndrome memory, the error checking and correcting logic further receiving the data written to the memory cells in the array and generating and storing in the syndrome memory error checking and correcting syndromes corresponding to respective subsets of bits of data written to the memory cells in the array; and
   control logic to cause the write data to be coupled from the data bus terminals to the array of memory cells and to cause the read data to be coupled from the array of memory cells to the data bus terminals.

2. The memory device of claim 1 wherein the syndrome memory comprises the array of memory cells to which the write data are written and the read data are read.

3. The memory device of claim 1 wherein the syndrome memory comprises a storage device that is separate from the array of memory cells to which the write data are written and the read data are read.

4. The memory device of claim 1 wherein the memory device comprises a dynamic random access memory device.

5. The memory device of claim 1 wherein the read data path comprises column interface circuitry containing the error checking and correcting logic.

6. The memory device of claim 5 wherein the column interface circuitry further comprises:
   a second set of column steering logic coupled to the error checking and correcting logic, the second set of column steering logic being operable to select a subset of read data bits from the subset of read data bits selected by the first set of column steering logic and coupled to the error checking and correcting logic.

7. The memory device of claim 1 wherein the control logic comprises an error checking and correcting controller coupled to the error checking and correcting logic for controlling the operation of the error checking and correcting logic.

8. A computer system, comprising:
   a processor;
   a memory device, comprising:
   an array of memory cells arranged in rows and columns;

a syndrome memory storing error checking and correcting syndromes corresponding to respective subsets of bits of data stored in the array of memory cells, the number of bits in each subset of data bits stored in the array of memory cells being less than the number of data bits stored in each row of memory cell in the array;

an address decoder receiving row addresses and column addresses, the address decoder activating a row of memory cells corresponding to each received row address and to select a memory cell in a column of memory cells corresponding to each received column address;

a read data path to couple read data from selected memory cells in an activated row to a predetermined number of data bus terminals, the predetermined number of data bus terminals being less than the number of bits in each subset of data bits stored in the array;

a write data path to couple write data from the predetermined number of data bus terminals to selected memory cells in an activated row;

a first set of column steering logic coupled to the array of memory cells, the first set of column steering logic selecting each of the subsets of data bits read from a corresponding subset of columns of the array of memory cells and outputting the selected subset of read data bits;

error checking and correcting logic coupled to receive the selected subset of read data bits from the first set of column steering logic and the corresponding error checking and correcting syndromes from the syndrome memory, the error checking and correcting logic generating an error checking and correcting syndrome in the memory device from the selected subset of read data bits and comparing the generated error checking and correcting syndrome to the error checking and correcting syndrome received from the syndrome memory, the error checking and correcting logic further receiving the data written to the memory cells in the array and generating and storing in the syndrome memory error checking and correcting syndromes corresponding to respective subsets of bits of data written to the memory cells in the array; and control logic epefableto cause the write data to be coupled from the data bus terminals to the array of memory cells and to cause the read data to be coupled from the array of memory cells to the data bus terminals; and a memory controller coupled to the processor and to the memory device, the memory controller causing the memory device to write data applied to the data bus terminals of the memory device and to read data that is coupled from the data bus terminals of the memory device.

9. The computer system of claim 8 wherein the syndrome memory comprises the array of memory cells to which the write data are written and the read data are read.

10. The computer system of claim 8 wherein the syndrome memory comprises a storage device that is separate from the array of memory cells to which the write data are written and the read data are read.

11. The computer system of claim 8 wherein the memory device comprises a dynamic random access memory device.

12. The computer system of claim 8 wherein the read data path comprises column interface circuitry containing the error checking and correcting logic.

13. The computer system of claim 12 wherein the column interface circuitry further comprises:

a second set of column steering logic coupled to the error checking and correcting logic, the second set of column steering logic being operable to select a subset of read data bits from the subset of read data bits selected by the first set of column steering logic and coupled to the error checking and correcting logic.

14. The computer system of claim 8 wherein the control logic comprises an error checking and correcting controller coupled to the error checking and correcting logic for controlling the operation of the error checking and correcting logic.

15. A memory system, comprising:

a memory controller to output memory write commands and memory read commands, and to transmit at least one M-bit word of write data and to receive at least one M-bit word of read data, where M is a positive integer;

a memory device coupled to the memory controller, the memory device comprising:

an array of memory cells arranged in rows and columns;

a syndrome memory storing error checking and correcting syndromes corresponding to respective sets of N M-bit words stored in the array of memory cells, where N is a plural positive integer, the number of bits in each of the sets of N M-bit words stored in the array of memory cells being less than the number of data bits stored in each row of memory cells;

an address decoder receiving row addresses and column addresses from the memory controller, the address decoder activating a row of memory cells corresponding to each received row address and to select a memory cell in a column of memory cells corresponding to each received column address;

a read data path to couple the at least one M-bit word of read data from selected memory cells in an activated row to the memory controller;

a write data path to couple the at least one M-bit word of write data from the memory controller to selected memory cells in an activated row;

a first set of column steering logic coupled to the array of memory cells, the first set of column steering logic selecting each of the sets of N M-bit words read from a corresponding set of columns of the array of memory cells and outputting the selected set of read N M-bit words;

error checking and correcting logic coupled to receive the selected sets of read N M-bit words from the first set of column steering logic and the corresponding error checking and correcting syndromes from the syndrome memory, the error checking and correcting logic generating an error checking and checking syndrome using the selected set of N M-bit words, the error checking and correcting logic further being to use the syndrome to check and correct the at least one of the selected sets of N M-bit words of read data coupled to the memory controller; and control logic to cause the write data to be coupled to the array of memory cells responsive to the write commands and to cause the read data to be coupled from the array of memory cells responsive to the read commands.

16. The memory system claim 15 wherein the memory controller operates to:

read P M-bit words from the memory device, where P is a positive integer;

combine the P M-bit words read from the memory device with N minus P M-bit words to create N M-bit words; and couple the created N M-bit words to the memory device to allow the error checking and correcting logic to use the created N M-bit words to generate the syndrome.

17. The memory system of claim 16 wherein M is equal to 32, N is equal to 4, and P is equal to 3.

18. The memory system of claim 15 wherein the memory controller operates to sequentially couple N M-bit words of write data to the memory device.

19. The memory system of claim 18 wherein M is equal to 32, and N is equal to 4.

20. The memory system of claim 15 wherein the syndrome memory comprises the same array of memory cells to and from which the at least one M-bit word of write data and read data are coupled.

21. The memory system of claim 15 wherein the syndrome memory comprises a storage device other than the array of memory cells to and from which the at least one M-bit word of write data and read data are coupled.

22. The memory system claim 15 wherein the memory device comprises a DRAM memory device.

* * * * *

UNITED STATES PATENT AND TRADEMARK OFFICE
CERTIFICATE OF CORRECTION

PATENT NO. : 7,340,668 B2 Page 1 of 1
APPLICATION NO. : 10/877720
DATED : March 4, 2008
INVENTOR(S) : Dean A. Klein It is certified that error appears in the above-identified patent and that said Letters Patent is hereby corrected as shown below:

In column 9, line 43, in Claim 8, delete "epefableto" and insert -- to --, therefor.

In column 10, line 52, in Claim 15, delete "checking and checking" and insert -- checking and correcting --, therefor.

Signed and Sealed this

Twenty-fourth Day of June, 2008

JON W. DUDAS
*Director of the United States Patent and Trademark Office*